(12) United States Patent
Simmons

(10) Patent No.: US 6,185,630 B1
(45) Date of Patent: Feb. 6, 2001

(54) DEVICE INITIALIZING SYSTEM WITH PROGRAMMABLE ARRAY LOGIC CONFIGURED TO CAUSE NON-VOLATILE MEMORY TO OUTPUT ADDRESS AND DATA INFORMATION TO THE DEVICE IN A PRESCRIBED SEQUENCE

(75) Inventor: Philip Simmons, San Jose, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 08/993,062

(22) Filed: Dec. 18, 1997

Related U.S. Application Data

(60) Provisional application No. 60/038,025, filed on Feb. 14, 1997.

(51) Int. Cl.[7] .................................................. G06F 13/10
(52) U.S. Cl. ............................... 710/10; 710/13; 370/457
(58) Field of Search ........................... 710/8, 9, 10, 104; 340/825; 370/457

(56) References Cited

U.S. PATENT DOCUMENTS

| | | | |
|---|---|---|---|
| 4,811,306 | * 3/1989 | Boning et al. | 365/200 |
| 5,274,771 | * 12/1993 | Hamilton et al. | 710/9 |
| 5,428,748 | * 6/1995 | Davidson et al. | 710/9 |
| 5,515,376 | 5/1996 | Murthy et al. . | |
| 5,559,965 | * 9/1996 | Oztaskin et al. | 710/104 |
| 5,689,726 | * 11/1997 | Lin | 710/10 |
| 6,014,714 | * 1/2000 | Plyler et al. | 710/8 |

* cited by examiner

Primary Examiner—Thomas C. Lee
Assistant Examiner—Albert Wang

(57) ABSTRACT

A low-cost implementation of a switching system using a multiport network switch avoids the necessity of a microprocessor by using programmable array logic (PAL) configured to drive a non-volatile memory. The PAL includes an address generator state machine, a PCI control signal state machine, and an interrupt state machine. The non-volatile memory sequentially outputs address and data information, under the control of the address generator state machine, onto a bus connected to the network switch in order to initialize the network switch with initialization and configuration data. The PCI control signal state machine provides control signals causing the output address and data information to mimic a PCI burst transfer. Once the network switch has been configured, the non-volatile memory outputs a start command causing the network switch to begin running in a free-running mode. A memory overflow interrupt in the network switch is also enabled, causing the PAL to reset the network switch if overloaded.

11 Claims, 7 Drawing Sheets

DEVICE INITIALIZING SYSTEM WITH PROGRAMMABLE ARRAY LOGIC CONFIGURED TO CAUSE NON-VOLATILE MEMORY TO OUTPUT ADDRESS AND DATA INFORMATION TO THE DEVICE IN A PRESCRIBED SEQUENCE

RELATED APPLICATIONS

This application claims priority from provisional patent application Ser. No. 60/038,025, filed Feb. 14, 1997, entitled INTEGRATED MULTIPORT SWITCH, which is incorporated herein by reference.

BACKGROUND OF THE INVENTION

1. Technical Field

The present invention relates to network switching and more particularly, to methods and systems for initializing, configuring, and initiating operation of network switches in packet switched networks.

2. Background Art

A packet switched network includes a repeater or a switch that enables communication of data packets between network stations. The switch or repeater may need to be initialized and configured to enable the communication of data packets between network stations.

Initialization and configuration typically is accomplished by a host microprocessor that configures and controls the switch or repeater prior to and during runtime. Microprocessors, however, can be relatively costly and can require substantial hardware and software resources to support the basic microprocessor operations. For example, the microprocessor implementations may require read-only memory (ROM) devices for storing the instruction sets and operating system code necessary for execution of the microprocessor, and non-volatile random access memory devices for storing routines for controlling the network repeater or switch. Additional interface devices may be necessary for data transfers between the host microprocessor and the network repeater or switch. Conversely, the host microprocessor may perform functions unnecessary to the operation of repeater or switch, resulting in an unnecessary cost to the management of the network switch.

SUMMARY OF THE INVENTION

There exists a need for a cost effective arrangement for initializing and configuring a network switch without the use of a microprocessor.

There is also a need for a low-cost switching system having a multiport switch and logic configured for initiating operations of the multiport switch without a microprocessor.

There is also a need for a low cost arrangement for halting, resetting, and restarting a network switch in response to a detected fault.

These and other needs are met by the present invention, where programmable array logic controls a non-volatile memory to initialize and configure a network switch by outputting configuration information to the network switch in a prescribed sequence that enables automatic operation of the network switch.

According to one aspect of the present invention, an apparatus for initializing a device includes a non-volatile memory configured for storing and outputting configuration information including address and data information, and logic configured for causing the non-volatile memory to output the address and data information to the device in a prescribed sequence to configure the device, the sequence including an initiate command causing the device to initiate operation following the configuration of the device. Use of the logic to cause the non-volatile memory to output the address and data information enables the device to be configured for initial operation without the necessity of a microprocessor. Moreover, the logic and non-volatile memory can be mass produced to provide a low-cost arrangement for hardware implementation of the device in its intended application.

Another aspect of the present invention provides a method for initializing a device, including storing configuration information for the device in a non-volatile memory, the configuration information including address information identifying configuration registers in the device and configuration data for the respective configuration registers, generating address signals from a logic device to the non-volatile memory causing the output of the configuration information from the non-volatile memory to the device in a prescribed sequence, and initiating operation of the device. Use of a logic device to generate the address signals enables the non-volatile memory to output the configuration information, including device-specific address and data fields, directly to the device without the necessity for any additional hardware, resulting in a low-cost implementation for the device.

Additional objects, advantages and novel features of this invention will be set forth in part in the description which follows, and in part, will become apparent to those skilled in the art upon examination or may be learned by practice of the invention. The objects and advantages of the invention may be realized and obtained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the arrangement for initializing the network switch according to the present invention. It will, apparent, however, that the present invention is also applicable to other packet switch systems, as described in detail below.

Switch Architecture

Figure 1:
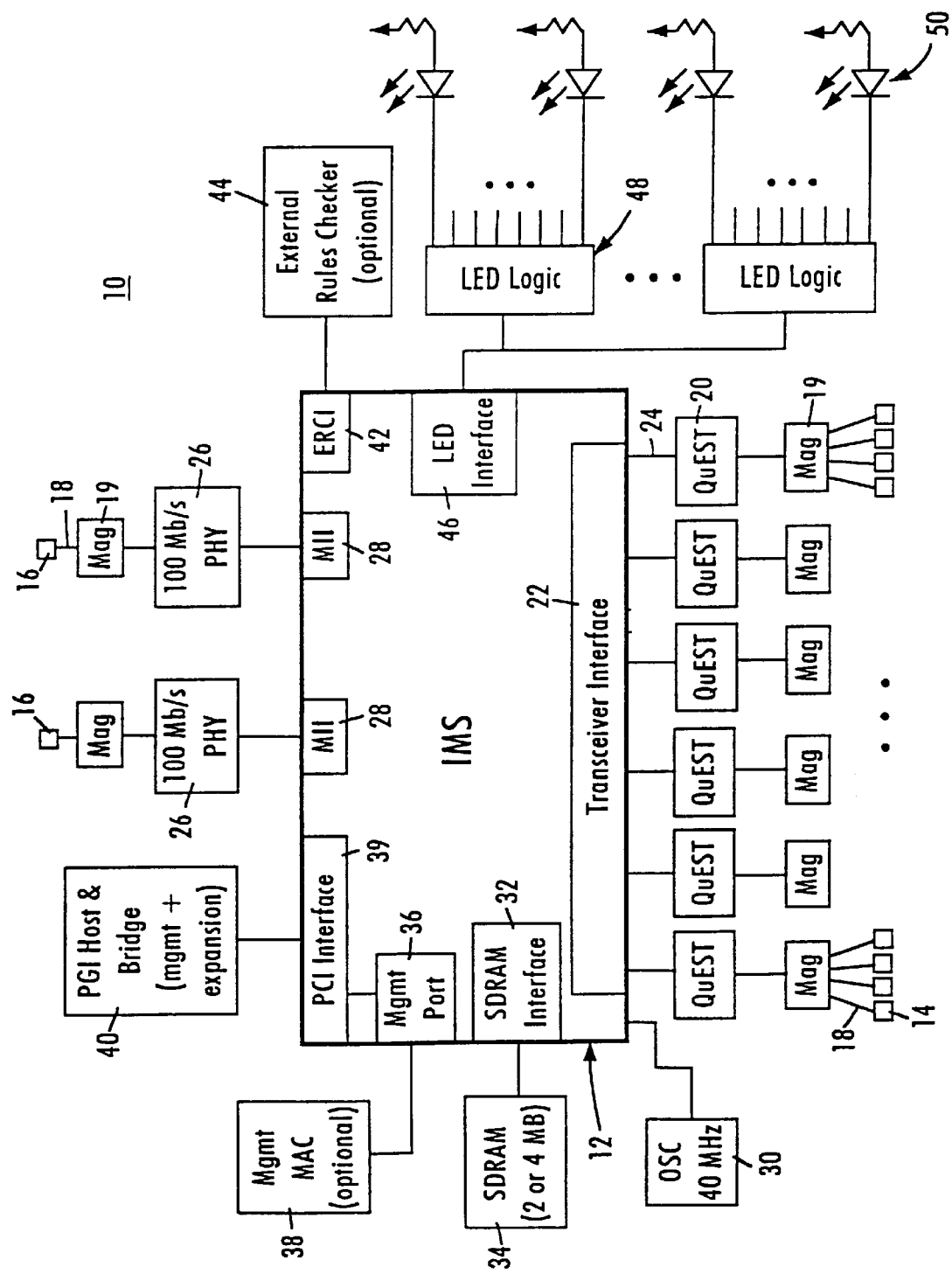
FIG. 1 is a block diagram of a packet switched system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabyte per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a desertion of a receive carrier on the media. Any station 14 having data to send will attempt to access the channel by waiting a predetermined time after the desertion of a receive carrier on the media, known as the interpacket gap interval (IPG). If a plurality of stations 14 have data to send on the network, each of the stations will attempt to transmit in response to the sensed desertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices 12.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 2:
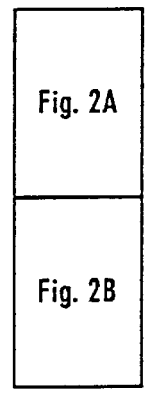
FIGS. 2A and 2B show a block diagram of a multiport switch constructed in accordance with an embodiment of the present invention and used in the packet switched system of FIG. 1.
Figure 2A:
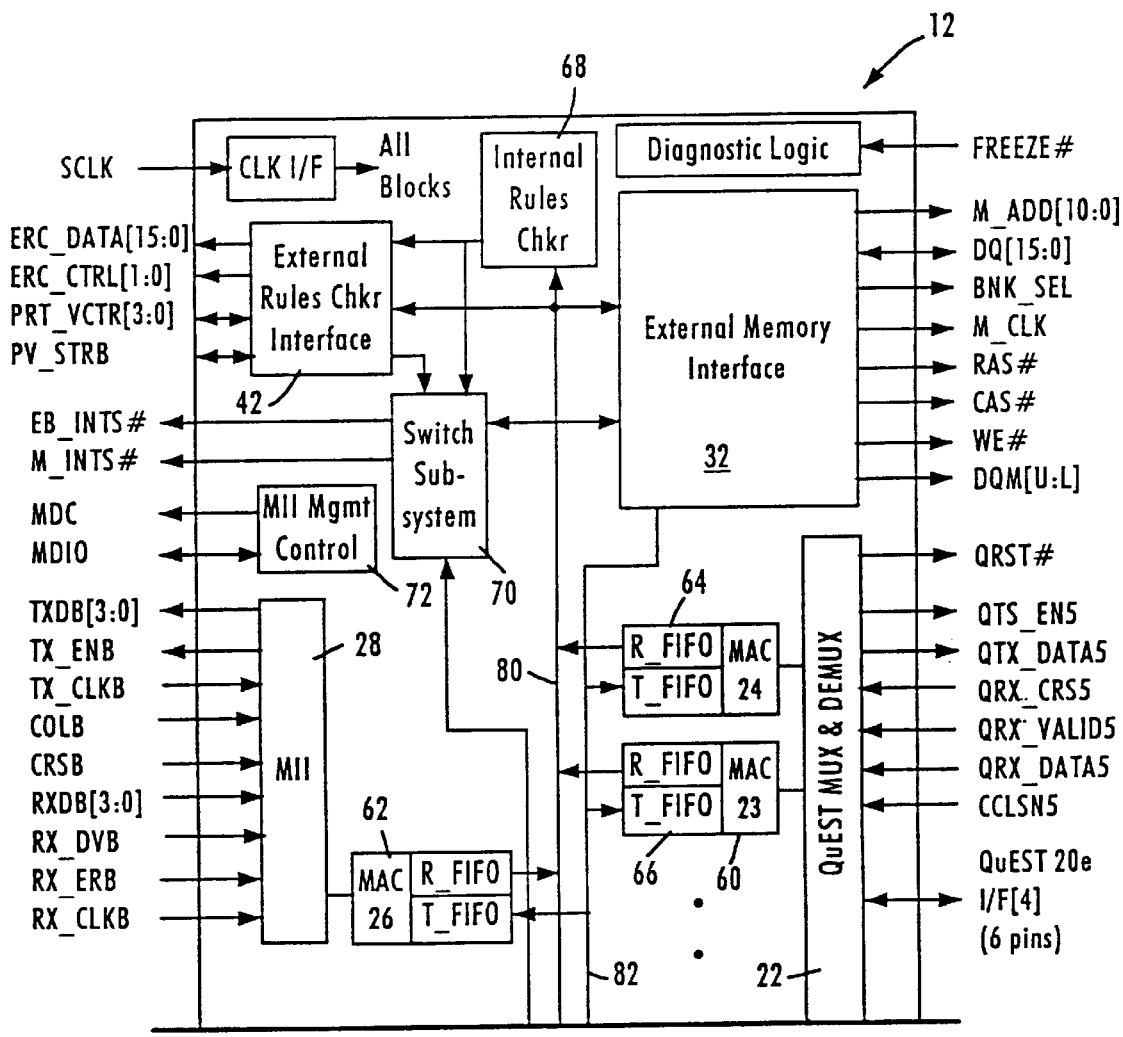
Figure 2B:
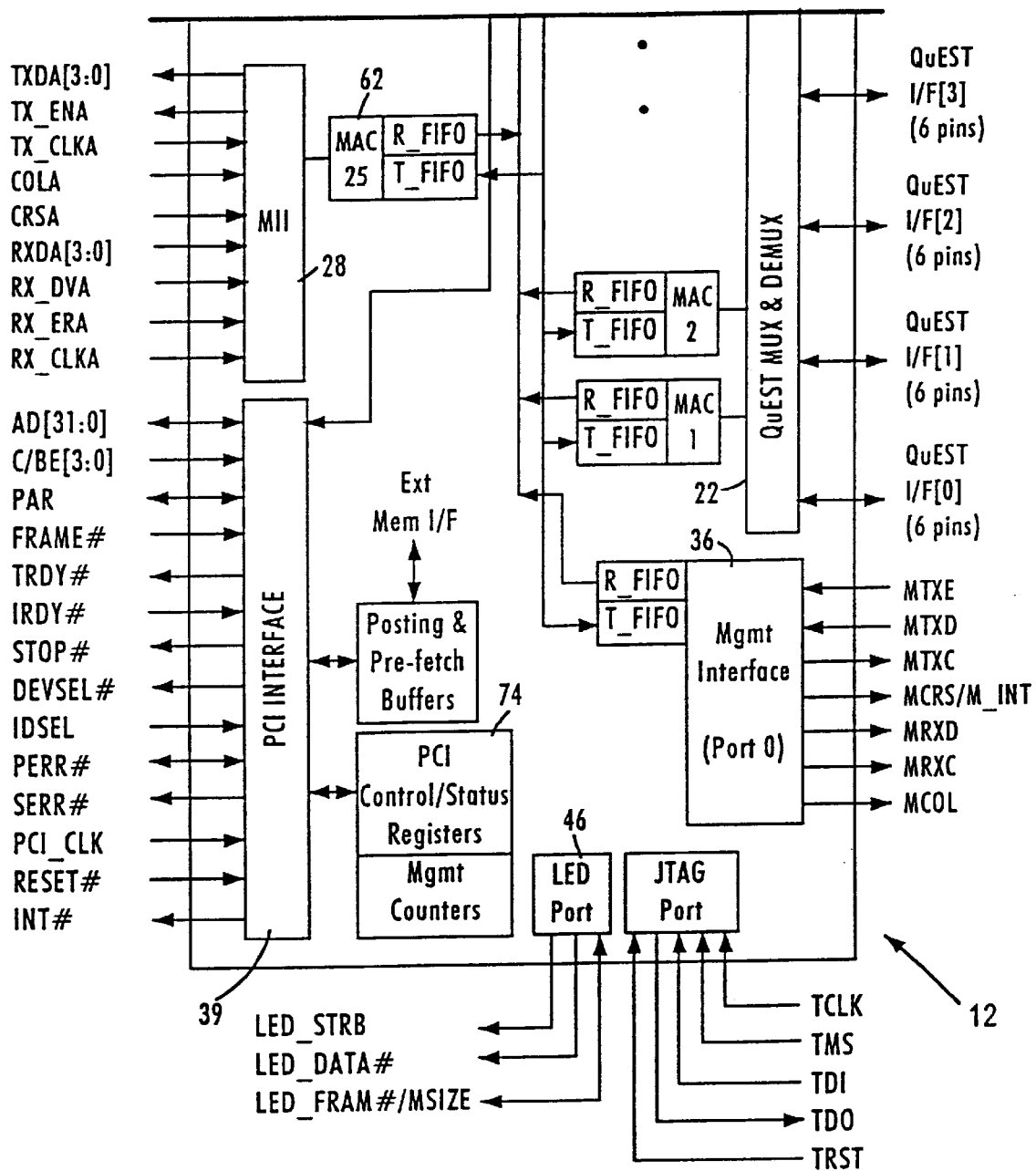

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 32, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802. 1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data I/O (MDI/O) signal path.

The PCI interface 39 is a 32-bit PCI revision 2.1 compliant slave interface for access by the PCI host processor 40 to internal IMS status and configuration registers 74, and access external memory SDRAM 34. The PCI interface can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
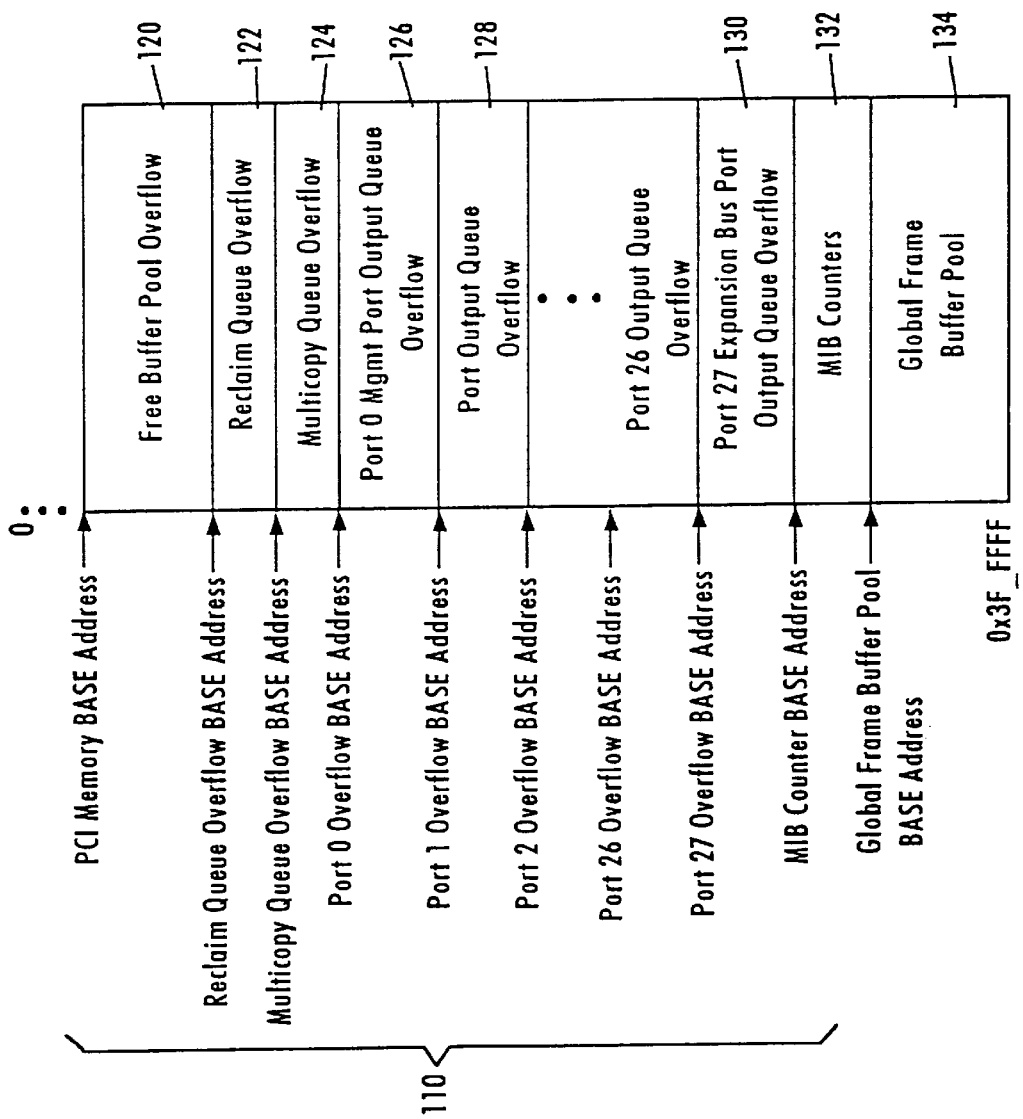
FIG. 3 is a memory map diagram of the external memory of FIG. 1, configured in accordance with an embodiment of the present invention.

FIG. 3 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool the excess free frame pointers identifying the currently unused buffers in the global frame buffer pool 134. The reclaim queue overflow area 122 stores for the reclaim queue excess frame pointers to linked-list chains that are no longer needed. The multicopy queue overflow area 124 stores for the multicopy queue excess frame pointers with copy numbers ">=1" (for queued frame pointers) and frame pointers with copy numbers "−1" (for successfully transmitted frames). The management port output queue overflow area 126 stores for the management port queue 74 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12.

The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104, or locations owned by the PCI host processor (not shown).

Network Switch Initialization

The present invention is directed to a low cost arrangement for initializing the multiport switch 12 by supplying the necessary configuration data, followed by supplying a command to cause the multiport switch 12 to begin operation in a free running mode. As described in detail below, the network switch 12 is configured using logic and non-volatile memory to supply configuration information to the network switch 12 in a prescribed sequence, mimicking the operation of the PCI host 40 without the use of a microprocessor.

Figure 4:
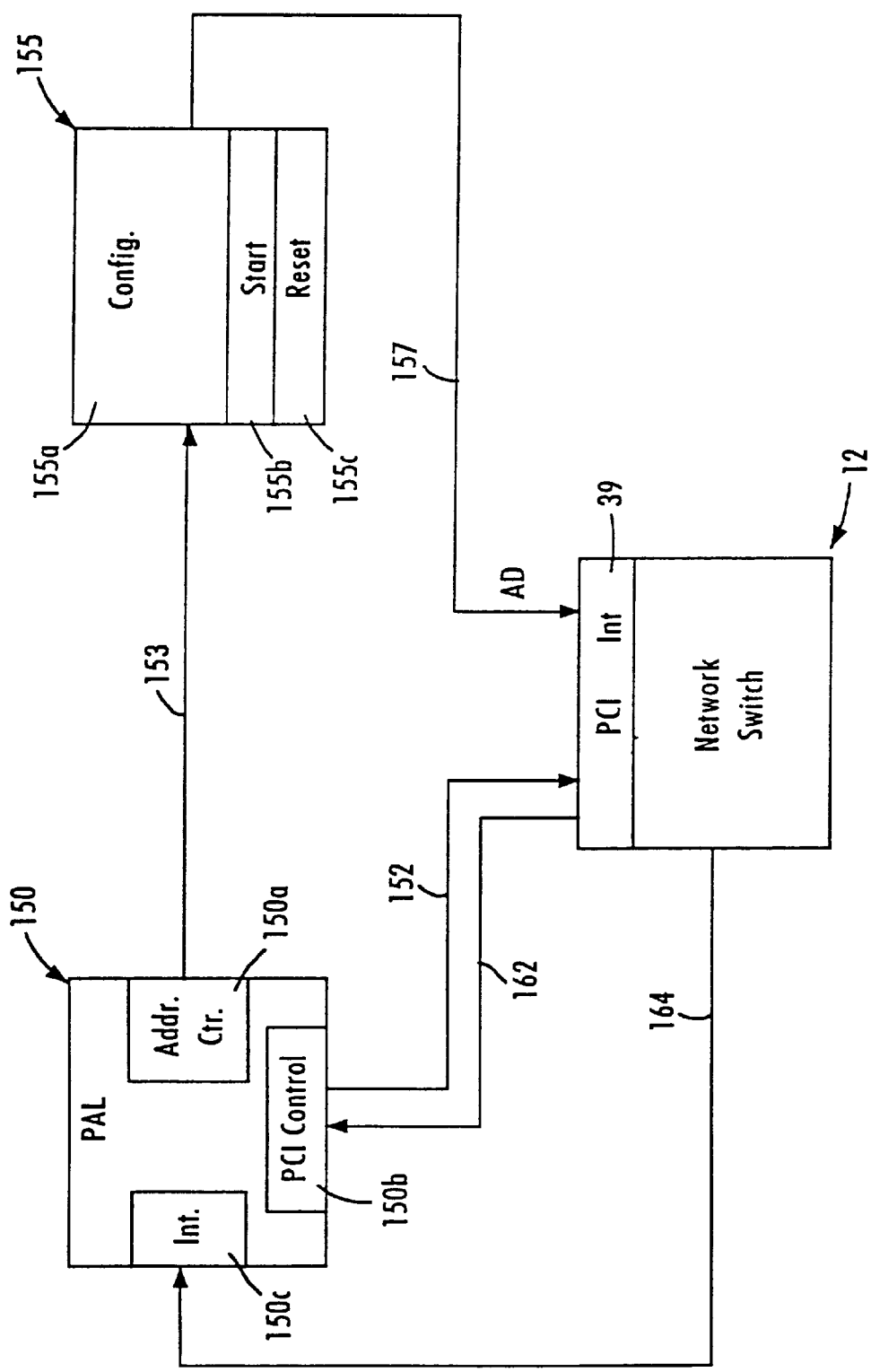
FIG. 4 is a block diagram of an apparatus for configuring and initializing the multiport switch of FIG. 2 according to an embodiment of the present invention.

FIG. 4 is an block diagram of an apparatus for configuring the multiport switch 12 according to an embodiment of the present invention. The apparatus includes a programmable array logic (PAL) 150 and a non-volatile memory 155 that are configured to mimic a PCI bus master. The multiport switch 12 is configured as a PCI bus slave device, where the network switch 12 writes data to (and reads data from) registers 74 and the external memory 34 in response to an address phase of a burst on the PCI interface 37.

The PAL 150 includes an address counting state machine 1 50a that outputs a prescribed sequence of addresses to the memory 155 via an address path 153. The memory 155 includes a configuration portion 155a, a start portion 155b, and a reset portion 155c. The configuration portion 155a stores configuration data in PCI address-data format, where a first memory location will store a PCI-based address and the next memory location will store the configuration data corresponding to the PCI-based address. According to the disclosed embodiment, the memory 155 outputs address phase information when the PAL 150 outputs an even address (including 0), and data phase information when the address output by PAL 150 is an odd address. The address counting state machine 150a outputs addresses to the memory 155 in a prescribed sequence, causing the memory 155 to output a PCI address, followed by the corresponding PCI data. Hence, the address sequence output by the counting state machine 150a causes the memory 155 to output a plurality of two-phase configuration writes to the network switch 12 via the address/data path (AD) 157 comprising an address phase and a corresponding data phase. The number of addresses output by the address counter state machine 150a is based on the total number of registers needed to write to multiport switch 12 multiplied by two (allowing for conversion from 16 bits to 32 bits) multiplied by two (accounting for address and data phase information).

The address phase and data phase information are comprised of either 16 bits or 32 bits (wherein 16 bits is the minimum data transfer requirement of multiport switch 12). Typically, address phase and data phase information are transmitted to the PCI interface 39 multiport switch 12 as 16 bits via the first 16 bits of the address data line (AD[15:0]) 157. Every two data transfers (the first transfer including address phase, the second transfer including data phase) from memory 155 to multiport switch 12 produces a 32 bit register write to the appropriate register within multiport switch 12.

The logic unit 150 includes a PCI control portion 150b for generating PCI bus control signals on a control signal path 152. The PCI bus control signals are output on control signal path 152 concurrently with the address and data phases on AD path 157 to mimic a PCI burst transfer. For example, multiport switch 12 distinguishes between a transmission of the address phase and the data phase using the Bus Control/Byte Enable (C/BE#) line of signal path 152. The PCI control 150b transmits "0101" across the four C/BE# lines of signal path 152 at the same time the address counter state machine 150a outputs an even address, indicating the information being transmitted on the signal path 157 is an address. Similarly, the PCI control 150b transmits "1100" across the four C/BE# lines of signal path 152 at the same time the address counter 150a outputs an odd address, indicating the information being transmitted on the upper two bytes of the 32-bit signal path 157 is valid configuration data. Hence, PAL 150 and the memory 155 use signal paths 152 and 157 respectively to create a virtual PCI burst transfer.

Figure 5:
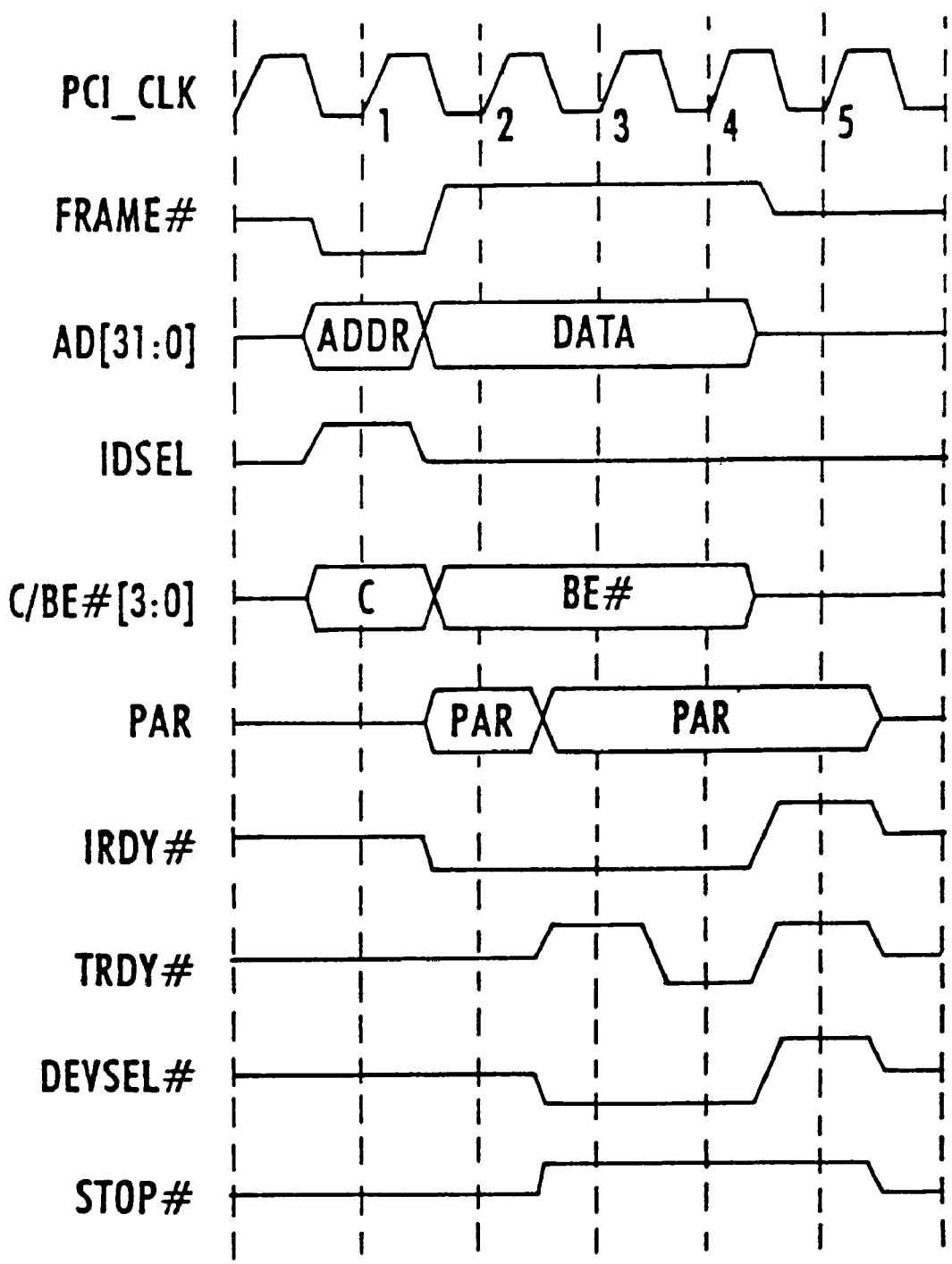
FIG. 5 is a timing diagram illustrating a configuration write access generated by the arrangement of FIG. 4.

FIG. 5 is a timing diagram illustrating a write operation to the multiport switch 12. The PCI control portion 150b outputs at least the following PCI control signals to the multiport switch 12 via the control signal path 152: PCI_CLK, FRAME#, IDSEL, C/BE#[3:0], AND IRDY.

The PCI_CLK signal is preferably derived by the PAL 150 from the oscillator 30 of FIG. 1, and is set to run at 20 MHz.

FRAME indicates when a bus transaction is beginning, and ensures that valid address and command data exists on signal path 157 (i.e., on AD[31:0] and C/BE[3:0]# lines of PCI interface 39). FRAME remains asserted while data transfers continue and is deserted one clock before the final data phase of a transaction, as illustrated in FIG. 5.

IDSEL acts as a chip select for multiport switch 12 during configuration read and write transactions.

The bus control and byte enable signal (C/BE) defines the bus command during the transmission of an address phase by memory 155. During the transmission of a data phase by memory 155 to multiport switch 12, C/BE is used as byte enables. The byte enables define the physical byte lanes that carry valid data. For example, C/BE0# (0001) corresponds to byte 0 (AD[7:0]) and C/BE3# (1000) corresponds to byte 3 (AD[31:24]).

IRDY indicates the ability of the initiator of a transaction (i.e., PAL 150 and memory 155) to complete the current data phase. During a transaction, IRDY is used in conjunction with TRDY, and wait states are inserted until both IRDY and TRDY are asserted simultaneously. A data phase is completed on any clock when both IRDY and TRDY are asserted. Multiport switch 12 samples IRDY during all write data phases to determine when valid data is present on AD[31:0]. Multiport switch 12 samples IRDY during read data phases to indicate when PAL 150 and memory 155 are ready to accept data.

The multiport switch 12 transmits a TRDY signal from PCI interface 39 to PAL 150 via signal path 162, indicating the ability of the target (i.e., the multiport switch 12) of a transaction to complete the current data phase. TRDY is used in conjunction with IRDY, and wait states are inserted until both IRDY and TRDY are asserted simultaneously. A data phase is completed on any clock when both IRDY and TRDY are asserted. Multiport switch 12 asserts TRDY during all read data phases to indicate when valid data is present on AD[31:0]. Multiport switch 12 asserts TRDY during write data phases to indicate when it is ready to accept data.

The memory 155 is stored with configuration information to configure the multiport switch 12 with switch-specific parameters. Specifically, the address counter state machine 150a causes the memory 155 to write configuration data in a selected portion of the PCI Control and Status Registers 74, shown in FIG. 2, to configure the network switch 12 for automatic operation.

Figure 6:
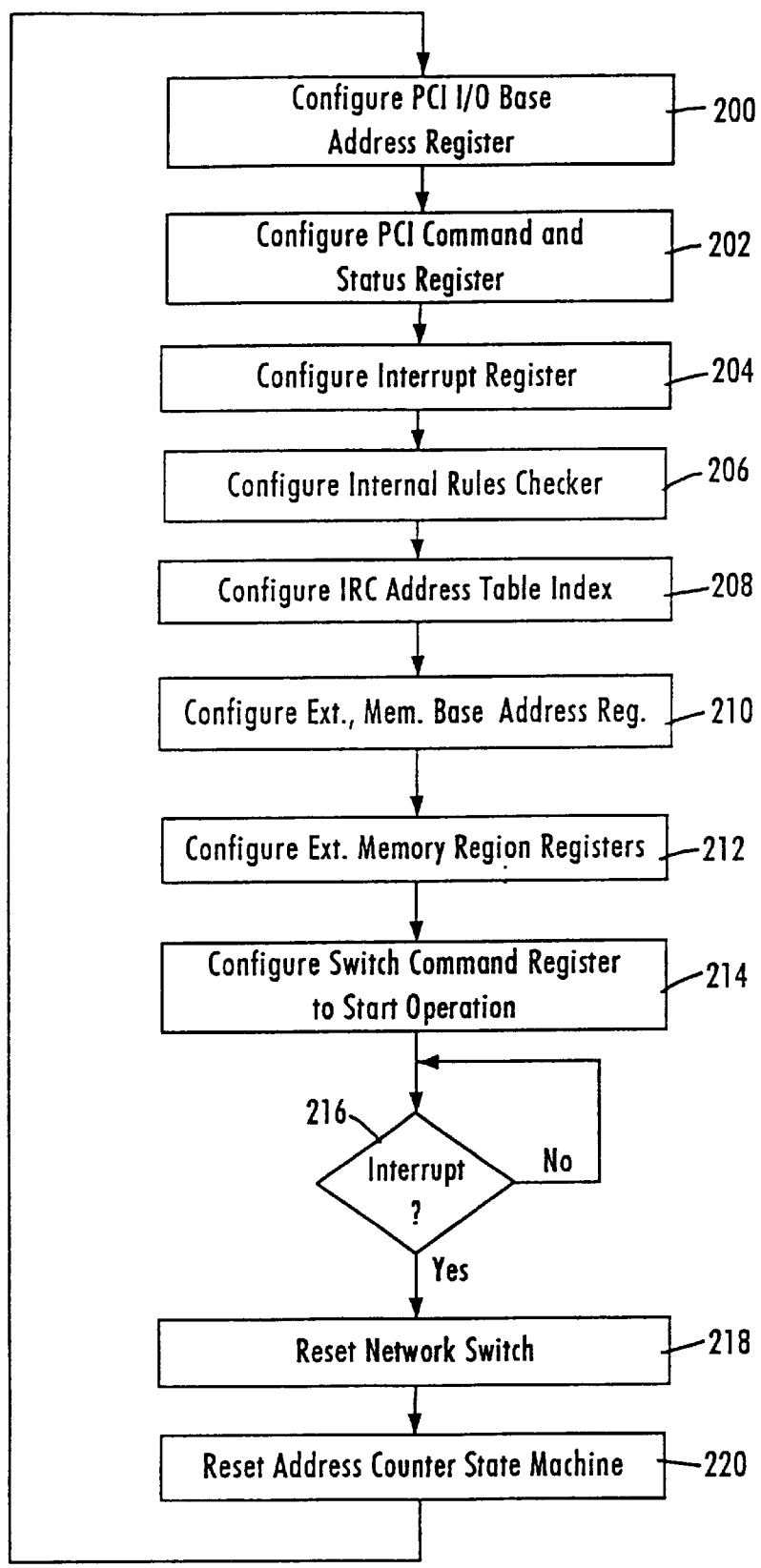
FIG. 6 is a diagram illustrating the method for configuring and initializing the multiport switch of FIG. 2 according to an embodiment of the present invention.

FIG. 6 is a flow diagram illustrating a method for configuring the multiport switch 12 according to an embodiment of the present invention. As described above, the multiport switch 12 is configured by outputting address and configuration data from the non-volatile memory 155 and writing the configuration data in the selected addressed registers within the control and configuration registers 74. The addressing of internal configuration registers 74 may be performed by storing an actual PCI I/O address within the non-volatile memory 155 (direct addressing), or by providing a two-phase addressing of the internal configuration registers based on a writable address port and data port used to access a second layer of registers (indirect addressing). In other words, the registers 74 may be arranged in a direct I/O space and an indirect I/O space to enable addressing a greater number of registers, where the direct I/O space includes an address port and a data port to the indirect I/O space. Hence, the memory 155 writes to a register in indirect I/O space by writing a first virtual PCI burst to the address port in direct I/O space, where the data phase includes the address of a register in indirect I/O space, followed by a second virtual PCI burst that writes the configuration data to the data port during the second phase of the second burst.

The logic 150 and the non-volatile memory 155 provide virtual PCI burst for configuring a plurality of the registers 74. The configuration data may be written as a single burst (direct I/O), using two memory locations of the non-volatile memory 155, or a double burst (indirect I/O), using four memory locations of the non-volatile memory 155.

As shown in FIG. 6, the logic 150 and the non-volatile memory 155 access a PCI I/O Base Address Configuration Register in step 200 to establish a base address for the multiport switch 12 and its configuration registers in the PCI address space. The actual address of the configuration registers 74 are thus based upon the relative offset to the PCI I/O Base Address Configuration Register value established in step 200. The logic 150 and the non-volatile memory 155 then configure a PCI Command and Status register in step 202 to enable full access of the registers 74 within the PCI address space.

The logic 150 and non-volatile memory 155 then output a virtual PCI burst to configure within the control status register 74 an Interrupt Register in step 204 to enable generation of an interrupt in the multiport switch 12 in the event that resources within the internal rules checker 68 are exhausted. Specifically, the internal rules checker 68 is configured to store a prescribed number of address table entries for respective source and destination addresses. If the address table in the internal rules checker 68 is filled due to autoregistration of a large number of MAC addresses over time, the network switch 12 generates a interrupt, causing the interrupt portion 150c to reset the network switch 12, described below.

The logic 150 and non-volatile memory 155 then generate a virtual PCI burst in step 206 accessing an IRC configuration register to configure the internal rules checker 68 to autoincrement, where the internal rules checker 68 performs an autolearning function for received data packets having unrecognized source addresses or destination addresses.

The logic 150 and non-volatile memory 155 then generate a virtual burst in step 208 to access IRC address table configuration registers for establishing the index structure of the internal rules checker address tables.

The memory map shown in FIG. 3 is then established by performing a virtual PCI burst transfer in step 210 storing an external memory base address in an External Memory Base Address Register, and by storing in step 212 respective external memory base address values for each of the external memory regions 110, 132, and 134.

Following configuration of the internal registers as described above, the logic 150 and the non-volatile memory 155 perform a virtual PCI burst transfer from the start memory region 155b in step 214 to configure a Switch Command Register in the PCI control status register 74 to begin operation by receiving and sending data packets through the network 10.

Hence, the disclosed arrangement enables the automatic configuration and initiation of the network switch 12 by using the logic 150 and the memory 155 to provide virtual PCI burst transfers that configure the network switch 12 with the necessary initialization parameters for automatic operation in a free running state. The address counter state machine 158 outputs a sequence of addresses to the non-volatile memory 155, resulting in the output of the address and data phases for the configuration segment 155a. Once the network switch 12 has been configured by completing the virtual PCI burst transfer of the configuration information in memory segment 155a, the appropriate start command is output from the non-volatile memory portion 155b to the switch command register within PCI control register 74 to begin operation of the network switch 12. The logic 150 is configured such that the address counter 150a halts after outputting the address storing the data phase of the start command in segment 155b.

The network switch 12 continues operating indefinitely until the network switch 12 determines that the internal rules checker 68 resources are depleted (e.g., if the IRC address tables are filled), causing generation of an interrupt along signal path 164. The interrupt logic 150c responds to the interrupt in step 216 by causing the address counter state machine 150a to increment by two address counter values in step 218, causing the non-volatile memory 155 to output the address and data phase of the reset portion 155c to the network switch 12. The appropriate PCI burst control signals are supplied by the PCI control 150b, causing the network switch to write the reset value from the memory 155c into the internal control registers, causing the network switch 12 to reset. The interrupt logic 150c then resets the address counter state machine 150a to a prescribed value in step 220, for example, "0", to reinitialize the network switch 12.

According to the present invention, a low-cost arrangement for initializing and initiating operation of a network switch use a logic device and a non-volatile memory having a prescribed sequence of address values and configuration data value for mimicking PCI burst transfers without the use of a microprocessor. Hence, the present invention enables controller-based systems to be configured for continuous, free-running operation without the necessity of a microprocessor.

It will be noted that the addressing of the non-volatile memory may have various modifications, since the alternating sequence of stored address and data values need not be sequential, but may have alternate patterns that mimic the data transfer by a microprocessor.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An apparatus configured to initialize a device, comprising:

a non-volatile memory configured to store and output configuration information including address and data information; and programmable array logic configured to cause the non-volatile memory to output the address and data information to the device in a prescribed sequence to configure the device, the sequence including an initiate command causing the device to initiate operation following the configuration of the device.

2. The apparatus of claim 1, wherein the non-volatile memory is a random access memory storing the configuration information as an alternating sequence of said address and data information, each address specifying a corresponding configuration register in the device.

3. The apparatus of claim 1, wherein the logic includes an address counter state machine outputting memory addresses to the non-volatile memory to generate the prescribed output sequence, and a PCI control portion for generating control signals that mimic a burst transfer on a PCI bus.

4. The apparatus of claim 3, wherein the logic further includes interrupt logic configured to control the address counter state machine to cause the non-volatile memory to output reset information to the device in response to an interrupt signal, the interrupt logic causing the non-volatile memory to output the prescribed sequence after the reset information.

5. A switching system comprising:

a non-volatile memory configured to store and output configuration information including address and data information to a device;

programmable array logic configured to cause the non-volatile memory to output the address and data information to the device in a prescribed sequence to initialize the device; and a network switch having configuration registers accessed by the respective address information configured to store the respective data information, the network switch controlling the transmission of data packets in a network between a controller and a destination station in response to reception of an initiate command from the non-volatile memory.

6. The system of claim 5, wherein the non-volatile memory is a random access memory storing the configuration information as an alternating sequence of said address and data information, each address specifying a corresponding one of the configuration registers.

7. The system of claim 5, wherein the logic includes an address counter state machine outputting memory addresses to the non-volatile memory to generate the prescribed output sequence, and a PCI control portion for generating PCI bus control signals, the network switch receiving the address and data information as a PCI burst transfer.

8. The system of claim 5, wherein the network switch generates an interrupt in response to a detected overflow condition, the logic in response causing the memory to output reset information to the network switch.

9. A method utilized to initiate a device, comprising the steps of:

utilizing non-volatile memory to store configuration information for the device, the configuration information including address information identifying configuration registers in the device and configuration data for the respective configuration registers;

utilizing programmable array logic to transmit address signals to the non-volatile memory, the programmable array logic being configured to cause outputting of the configuration information from the non-volatile memory to the device in a prescribed sequence; and initiating operation of the device.

10. The method of claim 9, further comprising resetting the device in response to an interrupt from the device by generating second address signals to the non-volatile memory specifying reset address and data locations.

11. The method of claim 9, further comprising generating control signals causing the output configuration information to mimic a PCI burst transfer.

* * * * *